United States Patent
Zistl et al.

(10) Patent No.: US 6,806,191 B2
(45) Date of Patent: Oct. 19, 2004

(54) SEMICONDUCTOR DEVICE WITH A COPPER LINE HAVING AN INCREASED RESISTANCE AGAINST ELECTROMIGRATION AND A METHOD OF FORMING THE SAME

(75) Inventors: Christian Zistl, Dresden (DE); Jörg Hohage, Dresden (DE); Hartmut Rülke, Dresden (DE); Peter Hübler, Coswig (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/304,579

(22) Filed: Nov. 26, 2002

(65) Prior Publication Data

US 2003/0224599 A1 Dec. 4, 2003

(30) Foreign Application Priority Data

May 31, 2002 (DE) .......................................... 102 24 167

(51) Int. Cl.[7] .............................................. H01L 21/44
(52) U.S. Cl. ........................ 438/687; 438/680; 438/651
(58) Field of Search ................................. 438/687, 644, 438/680, 729, 710; 257/762

(56) References Cited

U.S. PATENT DOCUMENTS

| | | | | |
|---|---|---|---|---|
| 5,447,887 A | * | 9/1995 | Filipiak et al. | 438/644 |
| 6,181,013 B1 | * | 1/2001 | Liu et al. | 257/762 |
| 6,355,571 B1 | * | 3/2002 | Huang et al. | 438/706 |
| 6,383,925 B1 | | 5/2002 | Ngo et al. | 438/677 |
| 6,432,822 B1 | | 8/2002 | Ngo et al. | 438/687 |
| 6,432,826 B1 | * | 8/2002 | Emami et al. | 438/692 |
| 2001/0030367 A1 | | 10/2001 | Noguchi et al. | 257/758 |

* cited by examiner

*Primary Examiner*—Phat X. Cao
*Assistant Examiner*—Theresa T. Doan
(74) *Attorney, Agent, or Firm*—Williams, Morgan & Amerson, P.C.

(57) ABSTRACT

A copper line that is formed in a patterned dielectric layer has a copper/silicon film formed on a surface thereof to substantially suppress an electromigration path through this surface. In an in situ process, the exposed copper surface is first cleaned by a reactive plasma ambient including nitrogen and ammonia and after a certain clean period, a gaseous compound comprising silicon, for example silane, is added to the reactive plasma ambient to form the copper/silicon film. Additionally, a capping layer may be deposited, wherein due to the copper/silicon film, any deposition technique or even spin-coating may be used.

21 Claims, 2 Drawing Sheets

SEMICONDUCTOR DEVICE WITH A COPPER LINE HAVING AN INCREASED RESISTANCE AGAINST ELECTROMIGRATION AND A METHOD OF FORMING THE SAME

BACKGROUND OF THE INVENTION

1. Field of the Invention

The present invention relates to the field of fabrication of integrated circuits, and, more particularly, to the formation of metallization layers and metal lines in which copper is used as the metallization metal.

2. Description of the Related Art

In the semiconductor industry, there is an ongoing effort to steadily increase the number of devices per unit area that may be fabricated of an appropriate substrate. Thus, current minimum feature sizes of approximately 0.2 $\mu$m and less are realized with the prospect of 0.1 $\mu$m in the near future. The decrease in feature size of the semiconductor devices allows the provision of increased integration density of the integrated circuits along with an improved device performance obtained by the size reduction of the individual elements, such as field effect transistors. The enormous number of semiconductor elements formed on a single chip area, however, reduces the available space for, and hence the cross-section of, metallization lines connecting these individual semiconductor elements. Although the feature size of the individual elements is reduced, the increased functionality and complexity of integrated circuits requires, on the other hand, a huge number of interconnect lines electrically connecting the individual circuit elements to provide for the required functionality. Due to the large number of interconnections required, which are provided in modern integrated circuits by a plurality of so-called metallization layers stacked on top of each other, the effective line length does not necessarily decrease in the same manner as the cross-sectional area of the lines is reduced, so that, in consequence, the electrical resistance in the interconnect lines increases, thereby partially offsetting the advantages obtained by reducing the feature sizes of the individual circuit elements. Consequently, the signal performance of modern integrated circuits may become restricted by the signal propagation delay caused by the interconnect lines rather than by the electrical characteristics of the individual circuit elements.

To reduce any parasitic RC time constants generated by the electrical resistance of the interconnect lines and the capacitance formed between adjacent lines, semiconductor manufacturers are increasingly tending to replace the most commonly used metal, aluminum, with a conductive material having a lower specific resistance. In this respect, copper has proven to be a viable candidate for metallization lines in ultra high density integrated circuits. Copper is an attractive substitute for standard aluminum lines and plugs, since copper films exhibit a much higher electromigration and stress void resistance than do aluminum films. However, the processing of copper in a semiconductor production line is extremely difficult, since patterning and etching of copper films is substantially impractical at lower process temperatures, making it more advantageous to deposit copper films into recesses of previously patterned dielectric layers and then to remove the excess metal by chemical mechanical polishing (CPM). This technique of forming metallization layers is also often referred to as damascene technique. A further disadvantage in using copper layers is the copper's characteristic to immediately form corrosion and discoloration at the surface upon exposure to a reactive, i.e., oxygen-containing ambient. Since corrosion and discoloration on the surface may lead to an insufficient adhesion to adjacent materials and to a deteriorated surface resistance, commonly, the copper is cleaned after exposure to an oxidized ambient and a cap layer is provided immediately after the cleaning process to passivate the metallization layer, thereby improving adhesion of the copper to adjacent materials and enhancing the long term stability of the metallization layer.

To this end, typically a capping layer, for example, a silicon nitride layer, is formed after cleaning the copper surface that has been exposed by a preceding chemical mechanical polishing process. A typical known process flow for fabricating a copper line with a capping layer in a damascene metallization structure may comprise the following steps.

After the recesses are formed in a dielectric layer, one or more seed layers are deposited over the structure for a subsequent electroplating deposition of copper. The one or more seed layers may also act as a barrier and adhesion layer to the adjacent dielectric layer. Alternatively, a separate barrier metal layer, e.g., tantalum, may be formed over the dielectric layer and in the recesses therein. Thereafter, a copper seed layer may be formed above the barrier metal layer.

Subsequently, bulk copper is deposited by electroplating to thereby fill the recesses in the dielectric layer. Thereafter, the excess material is removed by a CMP process. Thus, the planarized surface of the semiconductor structure comprises surface portions of copper as well as surface portions of dielectric material. Next, a cleaning treatment, by means of a reactive plasma, is performed to remove corrosion and discoloration, primarily consisting of copper oxide, formed on the exposed copper surface during and after the CMP procedure. The substrate is exposed to an ambient comprising nitrogen ($N_2$), ammonia ($NH_3$) and silane ($SiH_4$), which are continuously fed into a reaction chamber at a predefined flow rate for a predefined time interval, while a predefined pressure is maintained in the reaction chamber. Typical process parameters for this process may be as follows. All three gases are supplied to the reaction chamber for approximately 15–70 seconds with the substrate temperature maintained at approximately 400° C. In this way, discoloration and corrosion are reduced at the copper surface. Following this cleaning sequence, possibly interrupted by an additional purging step, nitrogen and silane is introduced into the reaction chamber to form a silicon nitride capping layer on top of the cleaned copper surface. Although the copper surface passivated in the manner as described above significantly relaxes the problems involved in forming reliable copper metallization layers, it turns out that the copper surface area of the copper line gives rise to another serious issue when feature sizes are steadily decreasing. With a reduced cross-sectional area, as required in sophisticated integrated circuits, the current densities within the metallization lines significantly increase and, even for copper lines with their superior characteristics compared to aluminum lines, an intolerable degree of electromigration is observed, resulting in a reduced reliability of the integrated circuit. In particular, the surface area of the copper line covered by the capping layer has been identified as one major electromigration path at higher current densities and increased temperatures.

In view of the above problems regarding the passivation of copper lines and the issues involved in increased electromigration of copper lines of reduced cross-sectional areas, a need exists for a new improved technique for protecting a copper surface during the manufacturing of a device and during the operation at elevated current densities and temperatures.

SUMMARY OF THE INVENTION

Generally, the present invention is based on the inventors' finding that electromigration on a copper surface can be effectively suppressed by forming a copper/silicon film at the surface, wherein the copper/silicon film may then be passivated by providing a corresponding capping layer, such as a silicon nitride layer.

According to one illustrative embodiment of the present invention, a method of protecting a copper surface in a semiconductor device comprises providing a substrate having formed thereon a dielectric layer with a recessed portion and copper structure positioned in the recessed portion, wherein the copper structure has at least one exposed copper surface. A first reactive plasma environment is created that comprises nitrogen and ammonia and the copper surface is exposed to the first reactive plasma environment for a first time interval. Subsequently, a second reactive plasma environment is created that comprises nitrogen, ammonia and a gaseous compound including silicon. Finally, the copper surface is exposed to the second reactive plasma environment for a second time interval that is shorter than the first time interval.

According to a further illustrative embodiment of the present invention, a method of protecting a copper surface in a semiconductor device comprises providing a substrate having formed thereon a dielectric layer having a recessed portion and copper structure positioned in the recessed portion, wherein the copper structure has at least one exposed copper surface. Next, the exposed copper surface is cleaned and a copper/silicon film is formed on the cleaned copper surface in situ.

According to yet another embodiment of the present invention, a semiconductor device, including a metallization structure, comprises a substrate including at least one copper structure, wherein the at least one copper structure has at least one copper surface with a copper/silicon film formed thereon.

BRIEF DESCRIPTION OF THE DRAWINGS

The invention may be understood by reference to the following description taken in conjunction with the accompanying drawings, in which like reference numerals identify like elements, and in which.

Figure 1A:
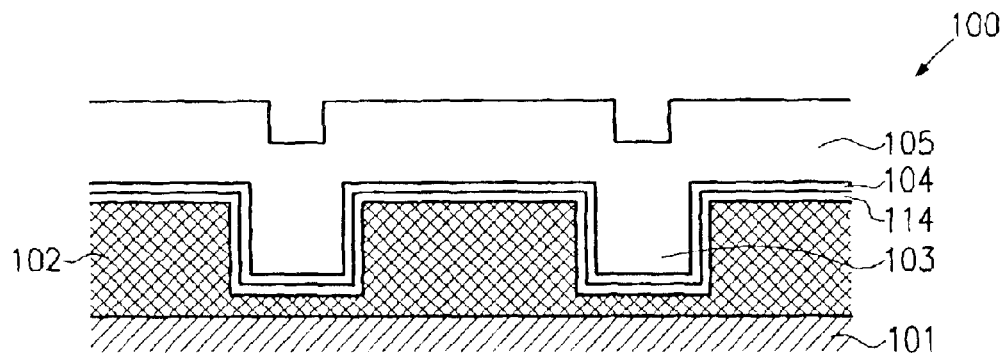
FIG. 1a shows a schematic cross-sectional view of a semiconductor structure with a patterned dielectric layer and a copper layer deposited thereon.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In the following, illustrative embodiments of the present invention will be described with reference to the formation of a copper metallization layer connecting a plurality of circuit elements, such as transistors, capacitors, resistors, and the like. It should be noted, however, that the present invention is also applicable to any process in which an exposed copper surface portion is to be covered by a protection layer that eliminates or reduces any corrosion and discoloration effects and also effectively reduces or suppresses any electromigration through the exposed copper surface.

FIG. 1a schematically shows a cross-sectional view of a structure 100 comprising a substrate 101, such as a silicon substrate or any other appropriate substrate for forming the required copper lines. In this particular embodiment, the structure 100 represents a semiconductor device including a metallization layer formed according to a typical damascene technique. The substrate 101 may comprise one or more material layers bearing individual circuit elements, such as field effect transistors, bipolar transistors, capacitors, resistors, and the like, that have to be connected to each other by one or more metallization layers. For convenience, the individual circuit elements are not explicitly shown in the figures, nor are any connections from the circuit elements to the overlying metallization layers depicted. A dielectric layer 102 is formed over the substrate 101 and is patterned to exhibit one or more recessed portions 103 which may be provided in the form of vias and trenches. The surface 102a of the dielectric layer, including the trenches 103, is covered by a barrier layer 114 and a copper seed layer 104. The barrier layer 114 may comprise a material that substantially prevents copper from diffusing into neighboring materials. A copper layer 105 is located over the dielectric layer 102 and the seed layer 104, wherein, depending on deposition parameters, the copper layer 105 exhibits a specific topology determined by the underlying pattern of the dielectric layer 102.

A typical process flow for forming the structure 100 shown in FIG. 1a involves the patterning of the dielectric layer 102 by well-known photolithographic and etching techniques, followed by the deposition of the barrier layer 114 and the copper seed layer 104 by means of, for instance, chemical vapor deposition (CVD) and sputter deposition, respectively. Subsequently, the bulk copper material is deposited by electroplating, providing the copper layer 105 as shown in FIG. 1a.

As previously noted, the copper layer 105, which has been deposited to a thickness sufficient to reliably fill the trenches 103, needs to be partially removed to obtain copper lines that are electrically insulated from each other. To this end, usually a chemical mechanical polishing (CMP) process is performed to remove the excess copper and, at the same time, substantially planarize the resulting surface of the structure 100.

Figure 1B:
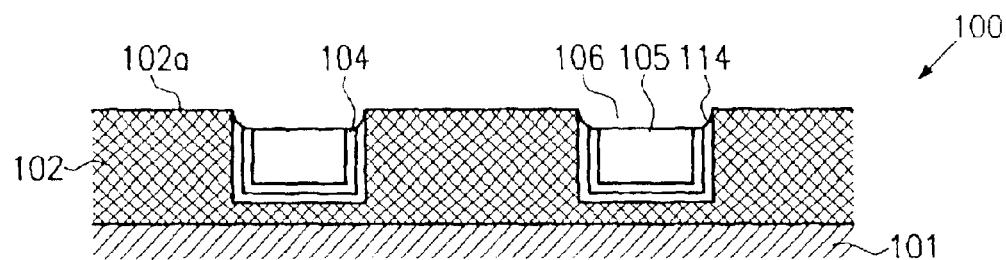
FIG. 1b shows the structure of FIG. 1a with the excess copper material removed by chemical mechanical polishing.

FIG. 1b schematically shows the cross-sectional view of the structure 100 after having been subjected to the chemical mechanical polishing process. In FIG. 1b, the excess copper has been removed so that copper lines 105 A are formed, having an exposed surface 106. Depending on the process parameters of the electroplating and the following CMP, the copper surface 106 may be slightly recessed compared to the surrounding surface 102 A of the dielectric layer 102. Moreover, during and after the chemical mechanical polishing process, the copper surface 106 is exposed to an oxidizing ambient and, due to the freshly polished surface, the copper surface 106 tends to immediately form erosion and discoloration portions. In view of device performance and reliability, it is, therefore, necessary to clean and passivate the copper surface 106 prior to the further processing of the structure 100. To this end, the structure 100 is subjected to a cleaning process within a reactive ambient followed by the formation of a protective layer.

Figure 2:
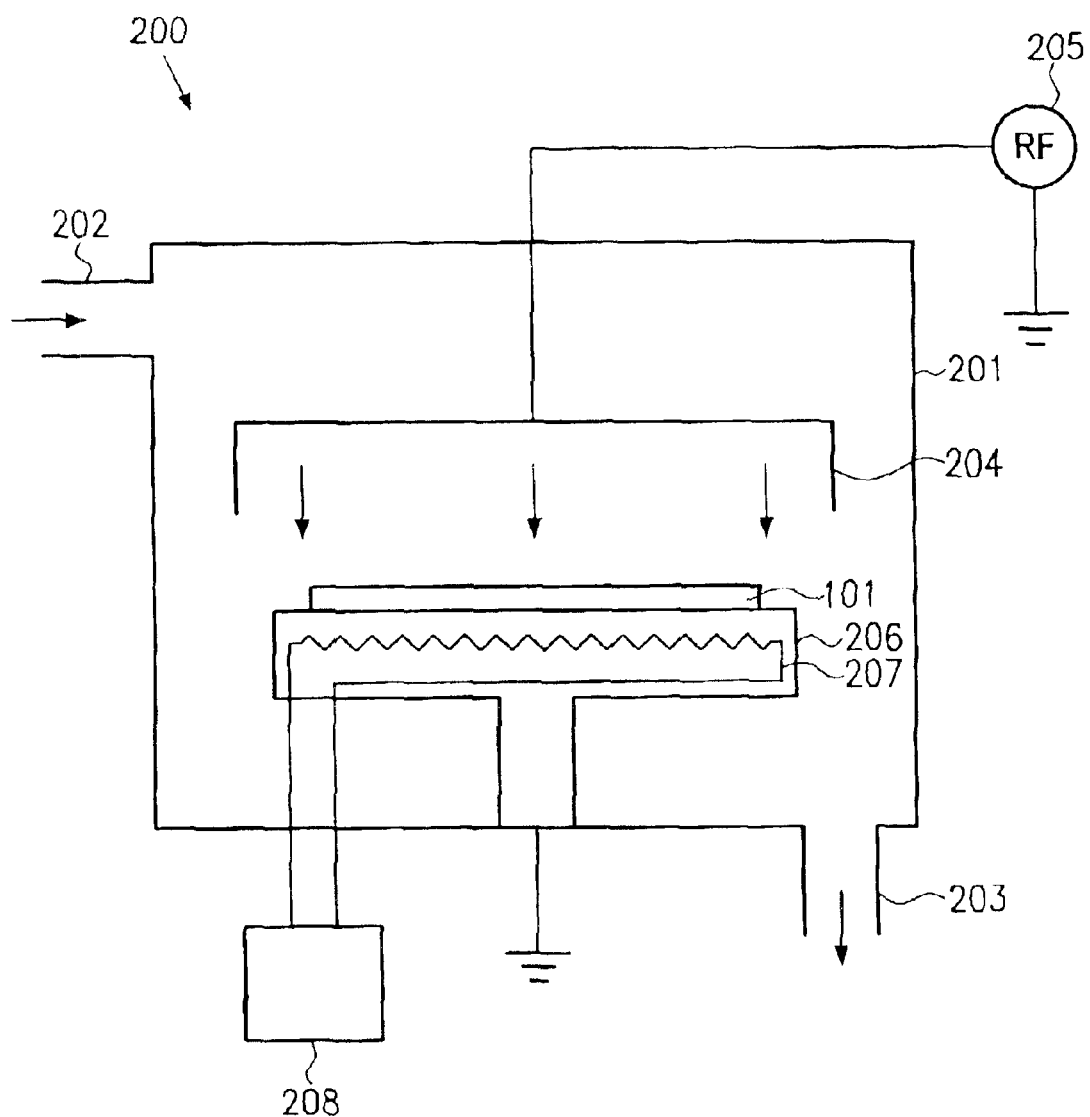
FIG. 2 schematically shows an over-simplified illustration of a process tool capable of performing plasma enhanced etching.

FIG. 2 shows a schematic view of a process tool that is capable of providing a reactive plasma ambient having the required characteristics for carrying out illustrative embodiments of the present invention to be described in the following. A process tool 200, which may be a typical plasma etching tool or a deposition tool for plasma enhanced material deposition, comprises a reaction chamber 201 including a supply line 202 and an exhaust line 203. The supply line 202 is adapted to deliver feed gases, such as nitrogen ($N_2$), ammonia ($NH_3$), silane ($SiH_4$) and the like, with an adjustable flow rate into the reaction chamber 201. The exhaust line 203 is adapted to discharge gases from the reaction chamber 201 and to establish a predefined pressure. It is thus to be understood that the supply line 202 as well as the exhaust line 203 are connected to appropriate means, which are for the sake of convenience not shown in the figures, to provide for the required gases and the required pressure within the reaction chamber 201. Moreover, excitation means 204 are provided to create a plasma ambient upon application of an appropriate radio frequency (RF) power and/or DC power delivered by a power source 205. A substrate holder 206 includes a heater 207 that is controlled by a corresponding heater controller 208. The substrate holder 206 is adapted to receive and support a substrate such as the substrate 101 of FIG. 1b.

In operation, nitrogen and ammonia are supplied to the reaction chamber 201 by the supply line 202 with an appropriate flow rate. In one embodiment, the nitrogen is supplied with a flow rate in the range of approximately 4000–10000 sccm. Ammonia is supplied with a flow rate of approximately 100–500 sccm. The temperature of the substrate 101 is adjusted to approximately 350–420° C., and more preferably to approximately 400° C., by means of the heater controller 208 and the heater 207. Upon application of an RF power of approximately 200-800 watts, a reactive plasma environment is established which will also be referred to as a first reactive plasma environment. In one particular embodiment, the first reactive plasma environment is maintained for a first time interval in the range of approximately 20–100 seconds during which discolored and corroded portions on the copper surface 106 are effectively removed. Contrary to the conventional process described above, here the clean step is performed without introduction of silane.

Figure 3A:
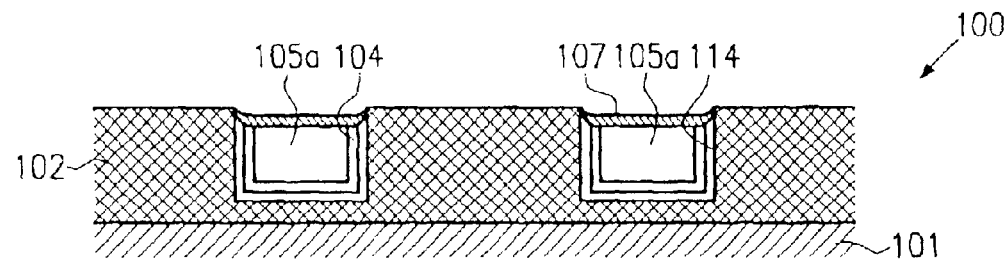
FIG. 3a schematically shows the semiconductor structure of FIG. 1b with a copper/silicon film formed on an exposed surface of the copper according to one illustrative embodiment.

After the cleaning process is performed, a gaseous compound containing silicon, such as silane, is added to the reaction chamber 201 so as to establish with the nitrogen and the ammonia still supplied to the reaction chamber 201 a second reactive plasma environment. In one embodiment, the gaseous silicon-containing compound is provided with a flow rate in the range of approximately 100–350 sccm. The second reactive plasma environment may be maintained for a second time interval that is shorter than the first time interval and may be in the range of approximately 3–10 seconds, and, according to one particular embodiment, may be approximately 5 seconds. The pressure in the reaction chamber is maintained at approximately 3–6 Torr. Thereby, as shown in FIG. 3a, a thickness of the copper/silicon film 107 of approximately 5–20 nm is obtained. During the exposure of the copper surface 106 to the second reactive plasma environment, the structural composition of the copper surface 106 is modified.

FIG. 3a shows a schematic cross-sectional view of the structure 100 after exposure to the first and second reactive plasma environments. In FIG. 3a, a copper/silicon film 107 is formed on and in the copper line 105A. The copper/silicon film 107 may have a structural composition comparable to an alloy, in which silicon atoms are built in the upper surface of the copper line 105A. Depending on process parameters, such as temperature, pressure and flow rate of the silicon-containing compounds, it is also possible that silicon reacts with copper to form a copper silicide film 107.

Investigations regarding the degree of oxygen in the copper/silicide film 107 and regarding the rate of electromigration of the completed semiconductor device revealed that the oxygen contents within the film 107, indicating the degree of discoloration and corrosion of the copper 105, is essentially the same as in devices manufactured in accordance with the conventional process sequence, whereas the amount of electromigration is significantly reduced. Substrates manufactured according to the conventional process described earlier and substrates manufactured according to the present invention have been subjected to a stress test with stress conditions commonly used in the industry.

As an illustrative example the following substrates have been prepared in the following way. A first group C1 of the conventionally processed substrates were treated: 20 seconds with nitrogen ($N_2$), ammonia ($NH_3$) and silane ($SiH_4$) at 400° C. A second group C2 of conventionally processed substrates were treated: 70 seconds with nitrogen ($N_2$), ammonia ($NH_3$) and silane ($SiH_4$) at 400° C. A first group I1 of the substrates according to the present invention were treated: 15 seconds with nitrogen ($N_2$) and ammonia ($NH_3$) at 400° C.; subsequently 5 seconds with nitrogen ($N_2$), ammonia ($NH_3$) and silane ($SiH_4$) at 400° C. A second group I2 of the substrates according to the present invention were treated: 65 seconds with nitrogen ($N_2$) and ammonia ($NH_3$) at 400° C.; subsequently 5 seconds with nitrogen ($N_2$), ammonia ($NH_3$) and silane ($SiH_4$) at 400° C. The flow rates and chamber pressure were identical for all substrates. The $t_{50}$ lifetime of the copper lines according to the Black's model commonly used to evaluate electromigration have been determined including the respective standard deviations sigma. The results are listed in the following table.

| Group | T$_{50}$ (hours) | Sigma |
|---|---|---|
| C1 | 4.5 | 0.40 |
| C2 | 4.9 | 0.36 |
| I1 | 21.3 | 0.35 |
| I2 | 37.0 | 0.59 |

From the table it is evident that I1 and I2 show a considerably longer t$_{50}$ and thus a significantly increased resistance against electromigration.

Figure 3B:
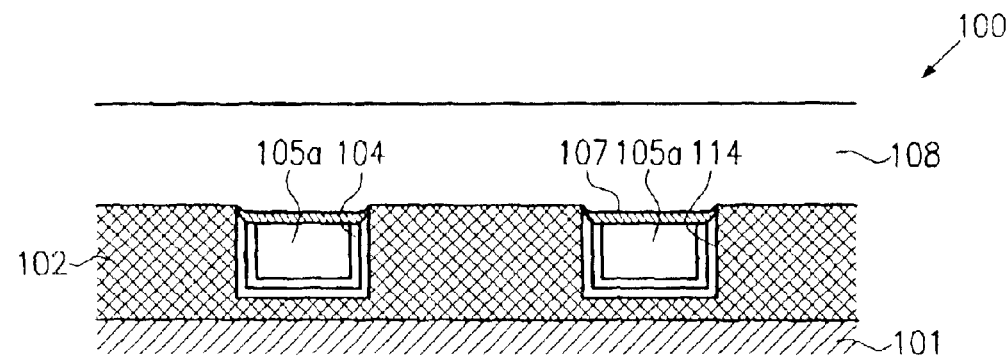
FIG. 3b schematically shows the semiconductor structure of FIG. 3a with an additional capping layer formed thereon.

According to a further illustrative embodiment, the structure 100 as shown in FIG. 3a may be further processed within the reaction chamber 201 to deposit silicon nitride as a further interlayer on the dielectric layer 102 and the copper/silicon film 107. FIG. 3b schematically shows the structure 100 including a second dielectric layer 108 that may be formed according to any of the embodiments described below.

Since the copper/silicon film 107 reliably prevents the underlying copper 105 from forming corrosion and discoloration, in other embodiments, an arbitrary additional dielectric layer may be deposited, wherein it is no longer necessary to use the same reaction chamber 201. Thus, the structure 100 may be conveyed to any appropriate deposition tool required for the dielectric layer under consideration. For instance, a silicon oxynitride layer or silicon dioxide layer may be deposited using a plasma enhanced CVD tool. In view of signal propagation delay, a low-k material may be deposited.

In one embodiment, the structure 100, having the copper/silicon film 107, is provided with a dielectric layer, such as glass or an appropriate polymer material, that is spin-coated onto the structure 100. Thus, the structure 100 having the copper/silicon film 107 allows the formation of any required dielectric material such as silicon nitride, silicon oxynitride, silicon dioxide, glass or any appropriate polymer layer without the risk of adversely affecting the copper line 105A owing to the formation of oxidized portions, so that any desired and suitable techniques for providing the insulating layer may be used, such as PVD, CVD, spin-coating, and the like. In particular, modifying the copper surface by providing the copper/silicon film 107 significantly suppresses electromigration through this film and thus, remarkably contributes to device performance and reliability.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of protecting a copper surface comprising:
    providing a substrate having formed thereon a dielectric layer with a recessed portion and copper structure positioned in the recessed portion, wherein the copper structure has at least one exposed copper surface;
    creating a first reactive plasma environment comprising nitrogen and ammonia;
    exposing the at least one exposed copper surface to the first reactive plasma environment for a first time interval;
    creating a second reactive plasma environment comprising nitrogen, ammonia and a gaseous compound including silicon; and
    exposing the at least one exposed copper surface to the second reactive plasma environment for a second time interval that is shorter than the first time interval to form a copper/silicon film on the at least one exposed copper surface.

2. The method of claim 1, wherein the first time interval is in the range of approximately 20–100 seconds.

3. The method of claim 1, wherein the second time interval is in the range of approximately 3–10 seconds.

4. The method of claim 3, wherein the second time interval is approximately 5 seconds.

5. The method of claim 1, wherein a temperature of said substrate during exposure to the first and second reactive plasma environments is adjusted to approximately 350–420° C.

6. The method of claim 5, wherein said temperature is adjusted to approximately 400° C.

7. The method of claim 1, wherein a flow rate of nitrogen is between approximately 4000–10000 sccm during the first and second time intervals.

8. The method of claim 1, wherein a flow rate of ammonia is approximately within 100–500 sccm during the first and second time intervals.

9. The method of claim 1, wherein a flow rate of said gaseous compound including silicon is within approximately 100–350 sccm.

10. The method of claim 1, wherein said gaseous compound, including silicon, is silane.

11. The method of claim 1, wherein a pressure of said first and second reactive plasma environments is maintained at approximately 3–6 Torr.

12. The method of claim 1, further comprising forming a dielectric layer on said copper/silicon film.

13. The method of claim 12, wherein forming a dielectric layer comprises at least one of depositing and spin-coating at least one of silicon nitride, silicon oxynitride, silicon dioxide, glass and a polymer material.

14. A method of protecting a copper surface comprising:
    providing a substrate having formed thereon a dielectric layer with a recessed portion and copper structure positioned in the recessed portion, wherein the copper structure has at least one exposed copper surface;
    creating a first reactive plasma environment comprising nitrogen and ammonia;
    exposing the at least one exposed copper surface to the first reactive plasma environment for a first time interval in the range of approximately 20–100 seconds;
    creating a second reactive plasma environment comprising nitrogen, ammonia and a gaseous compound including silicon; and
    exposing the at least one exposed copper surface to the second reactive plasma environment, for a second time interval in the range of approximately 3–10 seconds to form a copper/silicon film on the at least one exposed copper surface.

15. The method of claim 14, wherein a temperature of said substrate during exposure to the first and second reactive plasma environments is adjusted to approximately 350–420° C.

16. The method of claim 14, wherein a flow rate of nitrogen is between approximately 4000–10000 sccm during the first and second time intervals.

17. The method of claim 14, wherein a flow rate of ammonia is approximately within 100–500 sccm during the first and second time intervals.

18. The method of claim 14, wherein a flow rate of said gaseous compound including silicon is within approximately 100–350 sccm.

19. A method of protecting a copper surface comprising:

providing a substrate having formed thereon a dielectric layer with a recessed portion and copper structure positioned in the recessed portion, wherein the copper structure has at least one exposed copper surface;

creating a first reactive plasma environment comprising nitrogen and ammonia;

exposing the at least one exposed copper surface to the first reactive plasma environment for a first time interval in the range of approximately 20–100 seconds;

creating a second reactive plasma environment comprising nitrogen, ammonia and a gaseous compound including silicon; and exposing the at least one exposed copper surface to the second reactive plasma environment for a second time interval in the range of approximately 3–10 seconds to form a copper/silicon film on the at least one exposed copper surface, wherein a temperature of said substrate during exposure to the first and second reactive plasma environments is adjusted to approximately 350–420° C., a flow rate of nitrogen is between approximately 4000–10000 sccm during the first and second time intervals, and a flow rate of ammonia is approximately within 100–500 sccm during the first and second time intervals.

20. The method of claim 19, wherein a flow rate of said gaseous compound including silicon is within approximately 100–350 sccm.

21. The method of claim 19, wherein a pressure of said first and second reactive plasma environments is maintained at approximately 3–6 Torr.

* * * * *